(12) United States Patent
Chun

(10) Patent No.: US 6,781,891 B2
(45) Date of Patent: Aug. 24, 2004

(54) HALF POWER SUPPLY VOLTAGE GENERATOR AND SEMICONDUCTOR MEMORY DEVICE USING THE SAME

(75) Inventor: Ki-Chul Chun, Gyeonggi-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 43 days.

(21) Appl. No.: 10/349,386

(22) Filed: Jan. 21, 2003

(65) Prior Publication Data

US 2003/0137883 A1 Jul. 24, 2003

(30) Foreign Application Priority Data

Jan. 21, 2002 (KR) .................................. 10-2002-0003324

(51) Int. Cl.[7] ................................................ G11C 7/00
(52) U.S. Cl. ..................................... 365/189.1; 365/226
(58) Field of Search ............................ 365/189.11, 226; 326/112, 58

(56) References Cited

U.S. PATENT DOCUMENTS

| | | | |
|---|---|---|---|
| 5,528,548 A | 6/1996 | Horiguchi et al. | 365/226 |
| 5,847,579 A | 12/1998 | Trimberger | 326/41 |
| 6,137,318 A | * 10/2000 | Takaaki | 326/112 |
| 6,172,522 B1 | * 1/2001 | Kerr et al. | 326/58 |

* cited by examiner

*Primary Examiner*—M. Tran
(74) *Attorney, Agent, or Firm*—Marger Johnson & McCollom, P.C.

(57) ABSTRACT

The present invention relates to a half power supply voltage generating circuit and a semiconductor memory device having the same. The half power supply voltage generating circuit according to the present invention includes components that allow it to operate regardless of whether the power supply falls below a threshold voltage of included MOS transistors.

23 Claims, 6 Drawing Sheets

HALF POWER SUPPLY VOLTAGE GENERATOR AND SEMICONDUCTOR MEMORY DEVICE USING THE SAME

This application claims priority from Korean Priority Document No. 2002-3324, filed on Jan. 21, 2002, which is hereby incorporated by reference in its entirety.

BACKGROUND OF THE INVENTION

1. Field of the Invention

The present invention relates to a voltage generator. More particularly, the present invention relates to a half power supply voltage generator and a semiconductor memory device having the same.

2. Description of Related Art

A typical half power supply voltage generating circuit feeds back an output voltage to PMOS and NMOS transistors. The half power supply voltage generating circuit can output a stabilized half power supply voltage because resistance in the PMOS and NMOS transistors vary responsive to the feedback output voltage.

FIG. 1 is a circuit diagram of a half power supply voltage generating circuit comprised of PMOS transistors P1, P2, and P3 and NMOS transistors N1, N2, and N3. Referring to FIG. 1, the PMOS transistor P1, the NMOS transistor N1, the PMOS transistor P2, and the NMOS transistor N2 are serially connected between the power supply voltage terminal Vcc and ground voltage terminal. The NMOS transistor N3 and the PMOS transistor P3 are serially connected between the power supply voltage terminal Vcc and the ground voltage terminal. The PMOS transistor P1 comprises a source for receiving a power supply voltage Vcc, a gate connected to a node B and a drain connected to a node C. The NMOS transistor N1 comprises a drain and a gate commonly connected to node C, and a source connected to node A. The PMOS transistor P2 comprises a source connected to node A, and a gate, and a drain commonly connected to a node D. The NMOS transistor N2 comprises a drain connected to node D, a gate connected to node B and a source for receiving the ground voltage. The NMOS transistor N3 comprises a drain for receiving the power supply voltage Vcc, a gate connected to node C, and a source connected to the node B. The PMOS transistor P3 comprises a source connected to node B, a gate connected to node D, and a drain for receiving the ground voltage is applied. A substrate on which the PMOS transistors P1 and P3 are formed is connected to a bulk supply voltage. A substrate on which the PMOS transistor P2 is formed is connected to the substrate of the PMOS transistors P1 and P3. A substrate on which the NMOS transistors N1, N2, N3 are formed is connected to the bulk supply voltage.

The circuit of FIG. 1 operates as follows. The output voltage VOUT is half of the power supply voltage Vcc (node A is designed to be ½ Vcc). A voltage at node C becomes ½ Vcc+VTN. A voltage at node D becomes ½ Vcc−VTP. VTP is a threshold voltage of the PMOS transistor P2 and VTN is a threshold voltage of the NMOS transistor N1. Accordingly, the NMOS transistor N3 and the PMOS transistor P3 are both slightly turned on, thereby generating a stable output voltage VOUT with half power supply voltage. When output voltage VOUT decreases, the resistance of the PMOS transistor P1 decreases while the resistance of the NMOS transistor N2 increases, thereby raising a voltage at node A. The voltage at node C increases and the voltage at node D decreases as a result, so that the NMOS transistor N3 is turned on and the PMOS transistor P3 is turned off, thereby raising the voltage at node B.

On the other hand, when output voltage VOUT increases, the resistance of the NMOS transistor N2 decreases and the resistance of the PMOS transistor P1 increases, thereby decreasing the voltage at node A. Then, the voltage at node C decreases and the voltage at the node D increases, so that the PMOS transistor P3 is turned on and the NMOS transistor N3 is turned off, thereby decreasing the voltage at node B.

When the output voltage VOUT decreases to a level below the threshold voltages of the PMOS transistor P1 and/or the NMOS transistor N2, the PMOS transistor P1 and/or the NMOS transistor N2 turns off, making inoperable the half power supply voltage generating circuit.

This problem is particularly relevant when a low supply voltage Vcc is applied to the circuit of FIG. 1 because the threshold voltages of the transistors are not reduced in proportion to the supply voltage Vcc.

In general, the threshold voltage of the PMOS transistor P1 is greater than the threshold voltage of the NMOS transistor N2, so that the operation of the half power supply voltage generating circuit depends on the threshold voltage of the PMOS transistor P1. Accordingly, operation of the typical half power supply voltage generating circuit is disabled when the supply voltage Vcc is below a voltage value of VTP+VTN.

For example, assuming that the supply voltage Vcc is 1.5 V, the output voltage VOUT is 0.75 V. Assume threshold voltage of the PMOS transistor P1 is 0.8 V and the threshold voltage of the NMOS transistor N2 is 0.75 V. When the output voltage VOUT transits to 0.65 V from 0.75 V, a voltage between the source and the gate of the PMOS transistor P1 becomes 0.85 V and a voltage between the source and the gate of the NMOS transistor N2 becomes 0.65 V. Therefore, the NMOS transistor N2 is turned off, disabling the circuit.

Likewise, when the output voltage VOUT transits to 0.85 V from 0.75 V, a voltage difference between the source and the gate of the PMOS transistor P1 becomes 0.65 V and a voltage difference between the source and the gate of the NMOS transistor N2 becomes 0.85 V. Therefore, the PMOS transistor P1 is turned off, disabling the circuit.

In the half power supply voltage generating circuit of FIG. 1, when the supply voltage Vcc is below 1.55 V (VTP+ VTN), the output voltage VOUT becomes below 0.8 V, which is lower than a threshold voltage of the PMOS transistor P1 and/or a threshold voltage of the NMOS transistor N2. The PMOS transistor P1 and/or the NMOS transistor N2 are turned off and the circuit disabled.

A disadvantage of the half power supply voltage generating circuit of FIG. 1 is that it is inoperable when the output voltage of the half power supply voltage generating circuit is lower than a threshold voltage of the PMOS or NMOS transistors. This disadvantage is most often witnessed in advanced semiconductor memory devices where low supply voltages are common. And, the half power supply voltage generating is used to pre-charge bit-line pairs and data line pairs with half power supply voltage in semiconductor devices using relatively high supply voltages. The half power supply voltage generating circuit, however, can not be used to pre-charge bit-line and data line pairs in advanced semiconductor memory devices because the pre-charge voltage decreases to a level lower than the threshold voltage of the transistors included therein.

SUMMARY OF THE INVENTION

It is an object of the present invention to overcome the disadvantages associated with prior half voltage supply generating circuits.

It is another object of the present invention to provide a half power supply voltage generator capable of operating even if the half power supply voltage is lower than a threshold voltage of a transistor included therein.

It is yet another object of the present invention to provide a semiconductor device using a half power supply voltage generator capable of operating at a relatively low supply voltage.

A power supply voltage generating circuit is adapted to generate an output voltage. In one embodiment, the power supply voltage generating circuit comprises first active resistor means connected between a supply voltage and a first node, the first active resistor means having a resistance that varies responsive to the output voltage. First passive resistor means are connected in parallel to the first active resistor means. First voltage regulating means are connected between the first node and a second node adapted to regulate a voltage at the first node responsive to a voltage at the second node. Second voltage regulating means are connected between the second node and a third node adapted to regulate the voltage at the second node responsive to a voltage at the third node. Second active resistor means are connected between the third node and a ground voltage terminal, the second active resistor means having a resistance that varies responsive to the output voltage. Second passive resistor means are connected in parallel with the second active resistor means. A pull-up transistor is connected between the supply voltage and the output voltage and adapted to pull up the output voltage responsive to the voltage at the first node. And a pull-down transistor is connected between the ground voltage and the output voltage and adapted to pull down the output voltage responsive to the voltage at the third node.

In another embodiment, the half power supply voltage generating circuit comprises first passive resistor means connected between a supply voltage terminal and a first node. First active resistor means are connected between the supply voltage terminal and the first node, the first active resistor means operating responsive to an output voltage terminal. First voltage regulating means are connected between the first node and a second node and adapted to regulate a voltage at the first node responsive to a voltage at the second node. Second voltage regulating means are connected between the second node and a third node and adapted to regulate the voltage at the second node responsive to a voltage at the third node. Second active resistor means connected between the third node and a ground voltage terminal, the second active resistor means operating responsive to an output voltage terminal. Second passive resistor means are connected between the third node and the ground voltage terminal. A pull-up transistor is connected between the power supply voltage terminal and the output voltage for pulling up the output voltage responsive to the voltage at the first node. And a pull-down transistor connected between the third node and the ground voltage terminal for pulling down the output voltage responsive to the voltage at the third node.

A semiconductor memory device comprising a memory cell array including a plurality of memory cells formed at intersections of a plurality of word lines and a plurality of bit lines. A pre-charging means is adapted to pre-charge the plurality of bit lines with a half power supply voltage. And a half power supply voltage generating means is adapted to generate the half power supply voltage.

In one embodiment, the half supply voltage generating means of the semiconductor device includes first active resistor means connected between a supply voltage and a first node, the first active resistor means having a resistance that varies responsive to the output voltage. First passive resistor means is connected in parallel to the first active resistor means. First voltage regulating means is connected between the first node and a second node adapted to regulate a voltage at the first node responsive to a voltage at the second node. Second voltage regulating means is connected between the second node and a third node adapted to regulate the voltage at the second node responsive to a voltage at the third node. Second active resistor means is connected between the third node and a ground voltage terminal, the second active resistor means having a resistance that varies responsive to the output voltage. Second passive resistor means is connected in parallel with the second active resistor means. A pull-up transistor is connected between the supply voltage and the output voltage and adapted to pull up the output voltage responsive to the voltage at the first node. And a pull-down transistor is connected between the ground voltage and the output voltage and adapted to pull down the output voltage responsive to the voltage at the third node.

In another embodiment, the half supply voltage generating means of the semiconductor device includes first passive resistor means connected between a supply voltage terminal and a first node. First active resistor means are connected between the supply voltage terminal and the first node, the first active resistor means operating responsive to an output voltage terminal. First voltage regulating means are connected between the first node and a second node and adapted to regulate a voltage at the first node responsive to a voltage at the second node. Second voltage regulating means are connected between the second node and a third node and adapted to regulate the voltage at the second node responsive to a voltage at the third node. Second active resistor means are connected between the third node and a ground voltage terminal, the second active resistor means operating responsive to an output voltage terminal. Second passive resistor means are connected between the third node and the ground voltage terminal. A pull-up transistor is connected between the power supply voltage terminal and the output voltage for pulling up the output voltage responsive to the voltage at the first node. And a pull-down transistor is connected between the third node and the ground voltage terminal for pulling down the output voltage responsive to the voltage at the third node.

BRIEF DESCRIPTION OF THE DRAWINGS

For a more complete understanding of the present invention and the advantages thereof, reference is now made to the following descriptions taken in conjunction with the accompanying drawings, in which like reference numerals denote like parts.

DETAILED DESCRIPTION OF EMBODIMENTS

Reference will now be made in detail to embodiments of the present invention, example of which is illustrated in the accompanying drawings. Like references designate like elements in all accompanying drawings.

Figure 1:
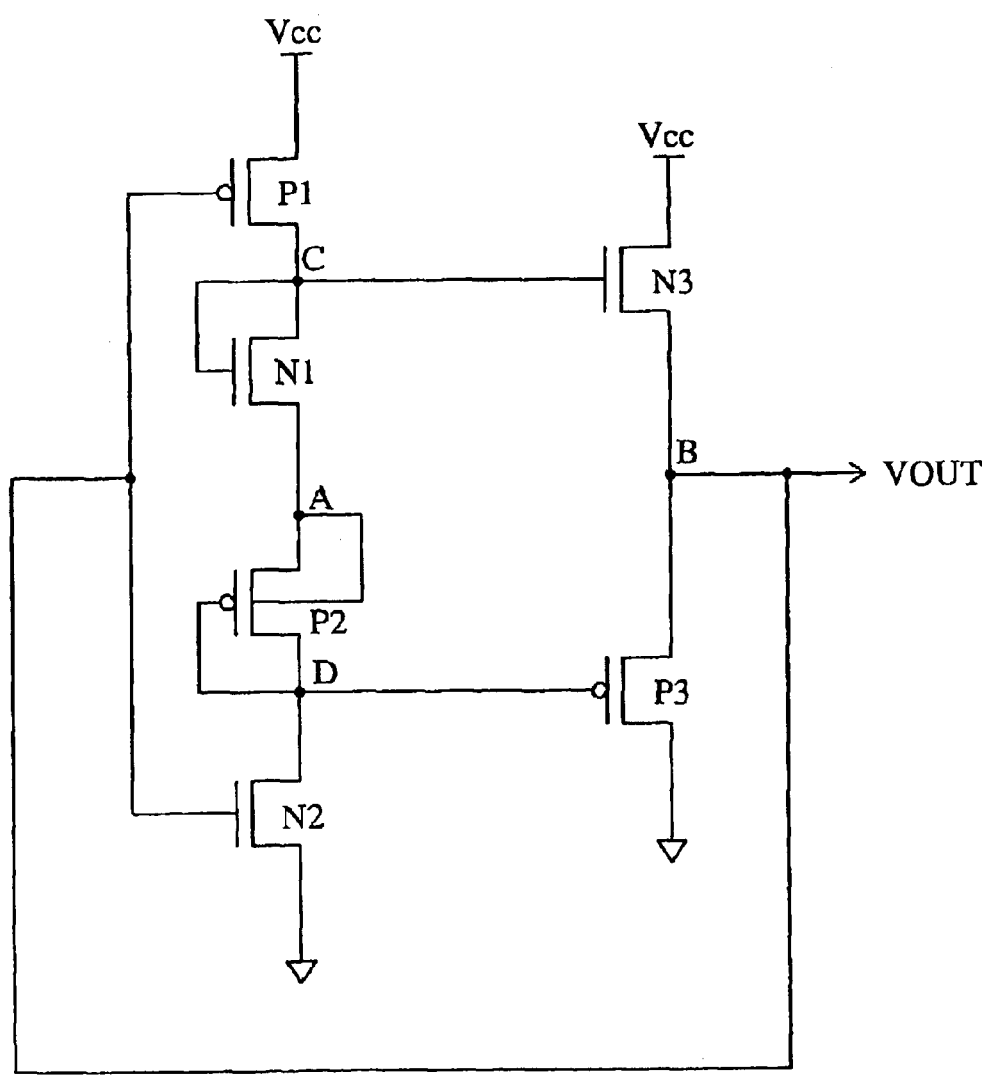
FIG. 1 is a circuit diagram of a half power supply voltage generating circuit.
Figure 2:
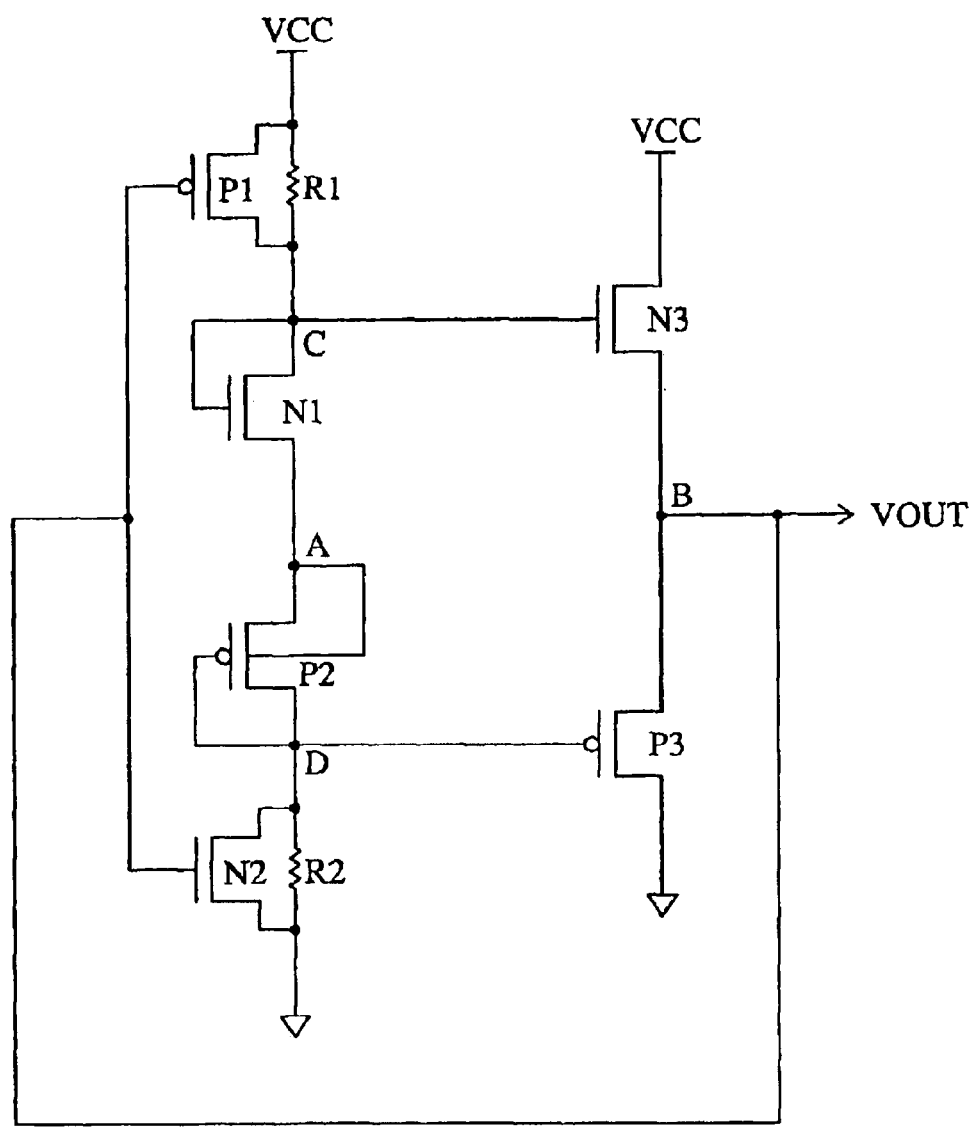
FIG. 2 is a circuit diagram of a half power supply voltage generating circuit according to an embodiment of the present invention.

FIG. 2 is a circuit diagram of a half power supply voltage generating circuit according to an embodiment of the present invention. Referring to FIG. 2, a first resistor R1 is connected between the source and the drain of the PMOS transistor P1. A second resistor R2 is connected between the source and the drain of the NMOS transistor N2.

The half power supply voltage generating circuit shown in FIG. 2 operates as follows. In the circuit of FIG. 2, the voltage at node A is half of the power supply voltage Vcc. The output voltage VOUT is, therefore, half the power supply voltage or ½ Vcc. Accordingly, the NMOS transistor N3 and the PMOS transistor P3 slightly turn on such that a stabilized half power supply voltage is generated.

When the output voltage VOUT decreases, the resistance of the PMOS transistor P1 decreases whereas resistance of the NMOS transistor N2 increases resulting in voltage increased at node A.

Then, the voltage at node B decreases to a level that is lower than the threshold voltage of the NMOS transistor N2. The circuit shown in FIG. 2 is not disabled because of resistor R2. The voltage at node C rises and the voltage at node D decreases, so that the NMOS transistor N3 is turned on and the PMOS transistor P3 is turned off. The voltage at node B is, therefore, recovered.

On the other hand, when the output voltage VOUT increases to a level greater than half power supply voltage ½ Vcc, resistance of the NMOS transistor N2 decreases and resistance of the PMOS transistor P1 increases. Therefore the voltage at node A decreases. At this time, the voltage at node B increases turning off the PMOS transistor P1. The circuit of FIG. 2, however, continues to operate because of resistor R1. The voltage at node C decreases and the voltage at node D increases such that the NMOS transistor N3 is turned off and the PMOS transistor P3 is turned on. The voltage at node B, therefore, decreases.

As discussed above, the half power supply voltage generating circuit in accordance with the present invention operates reliable and continuously generates a stable output voltage VOUT even if the output voltage VOUT is lower than a threshold voltage of the PMOS transistor P1 or a threshold voltage of the NMOS transistor N2.

The PMOS transistor P3 has a larger size than that of the NMOS transistor N3 due to its high resistance. By forming the PMOS transistor P3 to be a larger size than the NMOS transistor N3, the resistance of the PMOS transistor P3 decreases, so that the circuit generates stable half power supply voltage at lowered supply voltage.

Put differently, the voltage at node B decreases when the supply voltage is lowered, and the voltage difference between the gate and the source of the PMOS transistor P3 decreases. On the other hand, the PMOS transistor P3 has to be turned on to generate stable half power supply voltage as the output voltage VOUT. The resistance of the PMOS transistor must be low because the threshold voltage of the PMOS transistor P3 is fixed to turn on the PMOS transistor P3.

Figure 3:
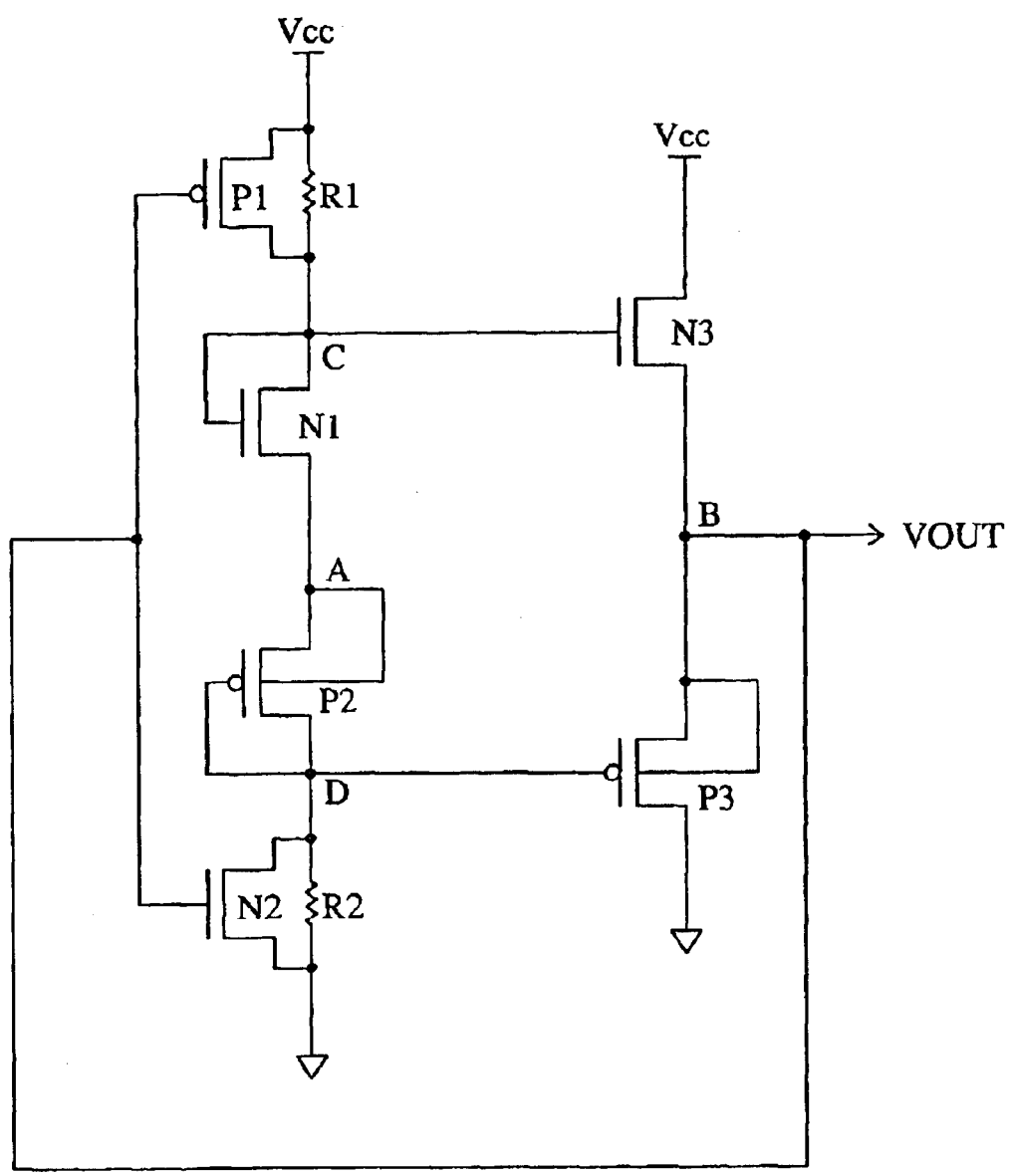
FIG. 3 is a circuit diagram of a half power supply voltage generating circuit according to an embodiment of the present invention.

FIG. 3 is a circuit diagram of the half power supply voltage generating circuit in according to an embodiment of the present invention. The circuit of FIG. 3 is almost the same as the circuit of FIG. 2 except that the PMOS transistor P3 is connected to the substrate on which it is formed. By connecting the substrate of the PMOS transistor P3 to its source, resistance of the PMOS transistor P3 decreases, decreasing the size of the PMOS transistor P3. The circuit of FIG. 3 operates the same as the circuit of FIG. 2.

Figure 4:
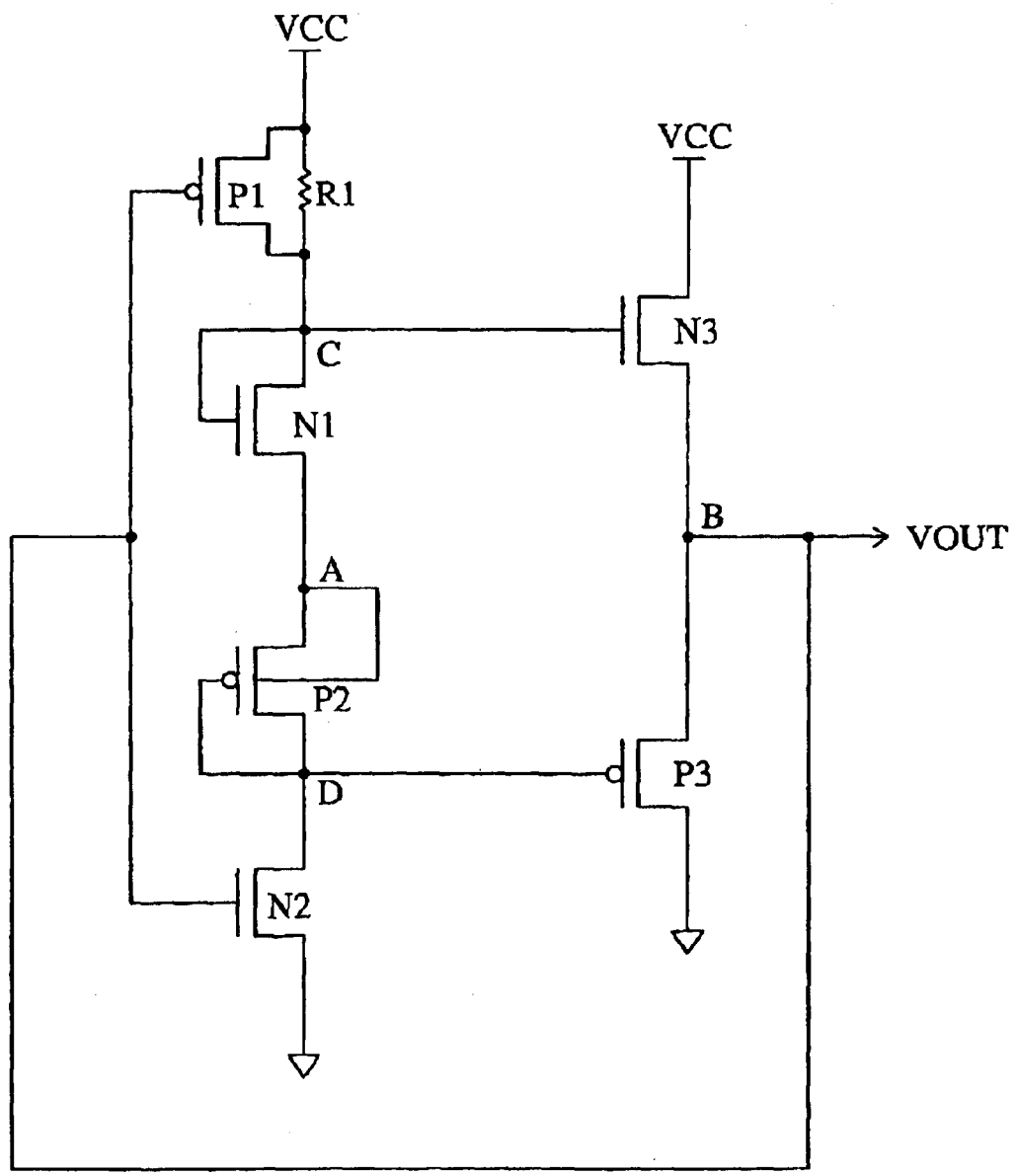
FIG. 4 is a circuit diagram of a half power supply voltage generating circuit according to an embodiment of the present invention.

FIG. 4 is a circuit diagram of the half power supply voltage generating circuit according to an embodiment of the present invention. The circuit of FIG. 4 is almost the same as the circuit of FIG. 2. The circuit shown in FIG. 4 is configured to delete the second resistor R2 from the circuit of FIG. 2. In FIG. 4, to compensate for deleting resistor R2, a threshold voltage of the NMOS transistor N2 is decreased to a very low level in the fabrication process. In general, it is very difficult to reduce a threshold voltage of a PMOS transistor but relatively easy to reduce a threshold voltage of an NMOS transistor during its manufacture. The circuit of FIG. 4 operates the same as the circuit of FIG. 2.

The circuit of FIG. 4 operates as follows. As the supply voltage level decreases, the voltage level at the node B decreases. The circuit of FIG. 4 is operational because the threshold voltage of the NMOS transistor N2 is low enough, and consequently the voltage level at node B is greater than a threshold voltage of the NMOS transistor N2

Figure 5:
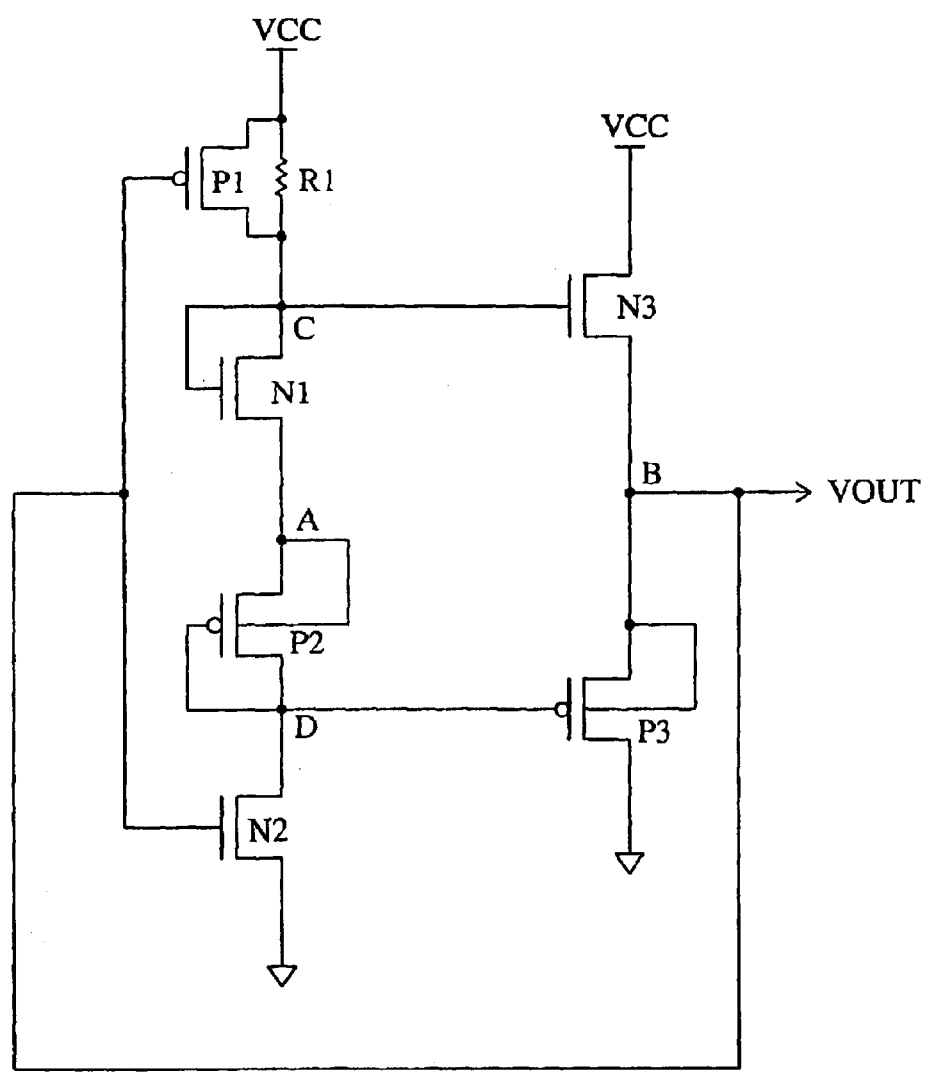
FIG. 5 is a circuit diagram of a half power supply voltage generating circuit according to an embodiment of the present invention.

FIG. 5 is a circuit diagram of the half power supply voltage generating circuit according to an embodiment of the present invention. The circuit of FIG. 5 is almost the same as the circuit of FIG. 4 except for the PMOS transistor P3. The source of the PMOS transistor P3 is connected to the substrate on which it is formed. By connecting the substrate of the PMOS transistor P3 to its source, the resistance of the PMOS transistor P3 decreases, so that size of the PMOS transistor P3 decreases. The circuit of FIG. 5 operates the same as the circuit of FIG. 4.

A person of reasonable skill in the art should recognize that each of the single resistors R1 and R2 might be replaced with a plurality of parallel-connected resistors. And, a person of reasonable skill in the art should recognize that the plurality of resistors might be connected to a predetermined control signal that varies its resistance.

Figure 6:
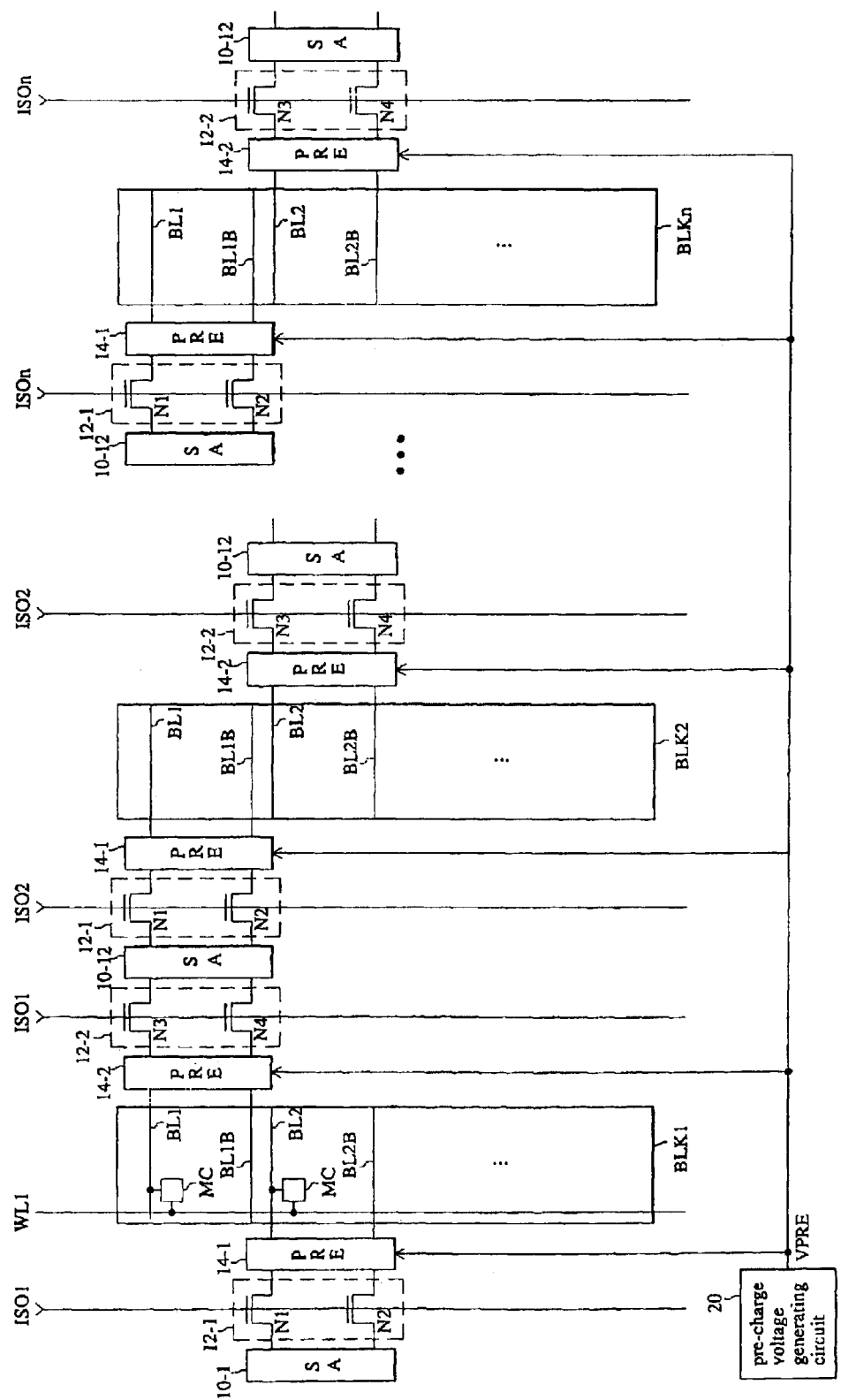
FIG. 6 is a semiconductor memory device having the half power supply voltage generating circuit of the present invention.

FIG. 6 is a block diagram of a semiconductor memory device having the half power supply voltage generating circuit according to the present invention.

As shown in FIG. 6, the semiconductor memory device comprises a plurality of memory cell array blocks BLK1, BLK2, . . . ,BLKn (n is an integer)and a plurality of bit line pairs BL1–BL1B, BL2–BL2B, . . . formed across each of the memory cell array blocks. A pre-charge circuit 14-1 and a bit line isolating circuit 12-1 are arranged along the left end of each of the bit line pairs. A pre-charge circuit 14-2 and a bit line isolating circuit 12-2 are arranged along the right end of each of the bit line pairs. Sense amplifiers 10-1, 10-2, 10-12 connect to each of the bit line pairs. The pre-charge voltage generating circuit 20 is the same as one of the circuits shown in FIG. 2 to FIG. 5.

The bit line isolating circuit 12-1 comprises two NMOS transistors N1 and N2. The bit line isolating circuit 12-2 comprises two NMOS transistors N3 and N4. Signals ISO1–ISOn are block selection signals for selecting a memory cell array block.

The semiconductor memory device shown in FIG. 6 operates as follows. First, the supply voltage is applied to the semiconductor memory device and the pre-charge voltage generating circuit 20 generates a pre-charge voltage e.g., half power supply voltage. Next, the pre-charging circuits 14-1, 14-2 start pre-charging the bit line pairs BL1–BL1B, BL2–BL2B, . . . , with half the power supply voltage. The pre-charge voltage output from the pre-charge voltage generating circuit 20 is always stabilized because the pre-charge voltage generating circuit 20 is formed of one of the half power supply voltage generating circuits shown in FIGS. 2 to 5. Further, even if the supply voltage Vcc decreases, the pre-charge voltage generating circuit 20 reliably generates and continuously transmits a stable half power supply voltage (e.g., ½ Vcc) to the pre-charging circuits 14-1, 14-2.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly constructed.

What is claimed is:

1. A power supply voltage generating circuit for generating an output voltage, comprising:

first active resistor means connected between a supply voltage and a first node, the first active resistor means having a resistance that varies responsive to the output voltage;

first passive resistor means connected in parallel to the first active resistor means;

first voltage regulating means connected between the first node and a second node adapted to regulate a voltage at the first node responsive to a voltage at the second node;

second voltage regulating means connected between the second node and a third node adapted to regulate the voltage at the second node responsive to a voltage at the third node;

second active resistor means connected between the third node and a ground voltage terminal, the second active resistor means having a resistance that varies responsive to the output voltage;

second passive resistor means connected in parallel with the second active resistor means;

a pull-up transistor connected between the supply voltage and the output voltage and adapted to pull up the output voltage responsive to the voltage at the first node; and a pull-down transistor connected between the ground voltage and the output voltage and adapted to pull down the output voltage responsive to the voltage at the third node.

2. The power supply voltage generating circuit of claim 1 wherein the first active resistor means is a PMOS transistor having a source, a gate, and a drain, the source being connected to the supply voltage, the gate being connected to the output voltage, and the drain being connected to the first node.

3. The power supply voltage generating circuit of claim 2 wherein the source of the PMOS transistor is connected to a substrate on which the PMOS transistor is formed.

4. The power supply voltage generating circuit of claim 1 wherein the first passive resistor means is a resistor.

5. The power supply voltage generating circuit of claim 1 wherein the second active resistor means is an NMOS transistor having a source, a gate, and a drain, the source being connected to the ground voltage, the gate being connected to the third node, and the drain being connected to the output voltage.

6. The power supply voltage generating circuit of claim 1 wherein the second passive resistor means is a resistor.

7. The power supply voltage generating circuit of claim 1 wherein the first voltage regulating means is an NMOS transistor having a source, a gate, and a drain, the source being connected to the first node and the gate and the drain being connected to the third node.

8. The power supply voltage generating circuit of claim 1 wherein the second voltage regulating means is a PMOS transistor having a source, a gate, and a drain, the source being connected to the second node and the gate and the drain being connected to the third node.

9. The power supply voltage generating circuit of claim 1 wherein the pull-up transistor is a NMOS transistor having a source, a gate, and a drain, the source being connected to the output voltage, the gate being connected to the first node, and the drain being connected to the supply voltage.

10. The power supply voltage generating circuit of claim 9 wherein the pull-down transistor is an PMOS transistor having a source, a gate, and a drain, the source being connected to the output voltage, the gate being connected to the third node, and the drain being connected to the ground voltage.

11. The power supply voltage generating circuit of claim 10 wherein the source of the PMOS transistor is connected to a substrate on which the PMOS transistor is formed.

12. Half power supply voltage generating circuit, comprising:

first passive resistor means connected between a supply voltage terminal and a first node;

first active resistor means connected between the supply voltage terminal and the first node, the first active resistor means operating responsive to an output voltage terminal;

first voltage regulating means connected between the first node and a second node and adapted to regulate a voltage at the first node responsive to a voltage at the second node;

second voltage regulating means connected between the second node and a third node and adapted to regulate the voltage at the second node responsive to a voltage at the third node;

second active resistor means connected between the third node and a ground voltage terminal, the second active resistor means operating responsive to an output voltage terminal;

second passive resistor means connected between the third node and the ground voltage terminal;

a pull-up transistor connected between the power supply voltage terminal and the output voltage for pulling up the output voltage responsive to the voltage at the first node; and a pull-down transistor connected between the third node and the ground voltage terminal for pulling down the output voltage responsive to the voltage at the third node.

13. The half power supply voltage generating circuit of claim 12 wherein the first active resistor means is a PMOS transistor having a source, a gate, and a drain, the source being connected to receive the supply voltage, the gate being connected to receive the output voltage, and the drain being connected to the first node.

14. The half power supply voltage generating circuit of claim 13 wherein the source of the PMOS transistor and a substrate on which the PMOS transistor is formed are commonly connected.

15. The half power supply voltage generating circuit of claim 12 wherein the passive resistor means is a resistor.

16. The half power supply voltage generating circuit of claim 12 wherein the second active resistor means is an NMOS transistor having a source, a gate, and a drain, the source being connected to receive the ground voltage, the gate being connected to receive the output voltage, and the drain being connected to the third node.

17. The half power supply voltage generating circuit of claim 12 wherein the first voltage regulating means is an NMOS transistor having a source, a gate, and a drain, the source and the gate being connected to the third node and the drain being connected to the first node.

18. The half power supply voltage generating circuit of claim 12 wherein the second voltage regulating means is a PMOS transistor having a source, a gate, and a drain, the source being connected to the second node, and the gate and the drain being commonly connected to the third node.

19. The half power supply voltage generating circuit of claim 12 wherein the pull-up transistor is an NMOS transistor having a source, a gate, and a drain, the source being connected to receive the output voltage, the gate being connected to the first node, and the drain being connected to receive the supply voltage.

20. The half power supply voltage generating circuit of claim 19, wherein the pull-down transistor is a PMOS transistor having a source, a gate, and a drain, the source being connected to receive the output voltage, the gate being connected to the third node, and the drain being connected to receive the ground voltage.

21. The half power supply voltage generating circuit of claim 20 wherein the source of the pull-up NMOS transistor and a substrate on which the NMOS transistor is formed are commonly connected.

22. A semiconductor memory device, comprising:
a memory cell array including a plurality of memory cells formed at intersections of a plurality of word lines and a plurality of bit lines;
a pre-charging means adapted to pre-charge the plurality of bit lines with a half power supply voltage; and
a half power supply voltage generating means adapted to generate the half power supply voltage;
wherein the half supply voltage generating means includes:
first active resistor means connected between a supply voltage and a first node, the first active resistor means having a resistance that varies responsive to the output voltage;
first passive resistor means connected in parallel to the first active resistor means;
first voltage regulating means connected between the first node and a second node adapted to regulate a voltage at the first node responsive to a voltage at the second node;
second voltage regulating means connected between the second node and a third node adapted to regulate the voltage at the second node responsive to a voltage at the third node;
second active resistor means connected between the third node and a ground voltage terminal, the second active resistor means having a resistance that varies responsive to the output voltage;
second passive resistor means connected in parallel with the second active resistor means;
a pull-up transistor connected between the supply voltage and the output voltage and adapted to pull up the output voltage responsive to the voltage at the first node; and
a pull-down transistor connected between the ground voltage and the output voltage and adapted to pull down the output voltage responsive to the voltage at the third node.

23. A semiconductor memory device, comprising:
a memory cell array including a plurality of memory cells formed at intersections of a plurality of word lines and a plurality of bit lines;
a pre-charging means adapted to pre-charge the plurality of bit lines with a half power supply voltage; and
a half power supply voltage generating means adapted to generate the half power supply voltage;
wherein the half supply voltage generating means includes:
first passive resistor means connected between a supply voltage terminal and a first node;
first active resistor means connected between the supply voltage terminal and the first node, the first active resistor means operating responsive to an output voltage terminal;
first voltage regulating means connected between the first node and a second node and adapted to regulate a voltage at the first node responsive to a voltage at the second node;
second voltage regulating means connected between the second node and a third node and adapted to regulate the voltage at the second node responsive to a voltage at the third node;
second active resistor means connected between the third node and a ground voltage terminal, the second active resistor means operating responsive to an output voltage terminal;
second passive resistor means connected between the third node and the ground voltage terminal;
a pull-up transistor connected between the power supply voltage terminal and the output voltage for pulling up the output voltage responsive to the voltage at the first node; and
a pull-down transistor connected between the third node and the ground voltage terminal for pulling down the output voltage responsive to the voltage at the third node.

* * * * *